United States Patent [19]
Mariyama et al.

[11] Patent Number: 5,293,051
[45] Date of Patent: Mar. 8, 1994

[54] PHOTOSWITCHING DEVICE INCLUDING A MOSFET FOR DETECTING ZERO VOLTAGE CROSSING

[75] Inventors: Mitsuru Mariyama; Nobuyuki Kato, both of Nara, Japan

[73] Assignee: Sharp Kabushiki Kaisha, Osaka, Japan

[21] Appl. No.: 16,546

[22] Filed: Feb. 11, 1993

[30] Foreign Application Priority Data

Feb. 14, 1992 [JP] Japan .................................. 4-28130
Jul. 10, 1992 [JP] Japan .................................. 4-183706

[51] Int. Cl.[5] ...................... H01L 29/74; H01L 27/02; H01L 29/34
[52] U.S. Cl. ...................................... 257/129; 257/121; 257/122; 257/124; 257/127; 257/128; 257/132; 257/133; 257/154; 257/167; 257/170; 257/494

[58] Field of Search ............... 257/119, 121, 122, 124, 257/126, 127, 128, 129, 132, 133, 146, 154, 162, 167, 170, 494

[56] References Cited

U.S. PATENT DOCUMENTS

4,622,568 11/1986 Schutten et al. .................... 257/122

*Primary Examiner*—Ngan Ngo
*Attorney, Agent, or Firm*—Nixon & Vanderhye

[57] ABSTRACT

A switching device includes a thyristor and a MOSFET, and a voltage clamp circuit. The voltage clamp circuit includes an N+ type contact region formed in a surface layer of a N type substrate and electrically connected to a gate electrode of a MOSFET, and a P type guard ring surrounding the contact region.

8 Claims, 6 Drawing Sheets

PHOTOSWITCHING DEVICE INCLUDING A MOSFET FOR DETECTING ZERO VOLTAGE CROSSING

BACKGROUND OF THE INVENTION

1. Field of the Invention

The present invention relates to a switching device such as a phototriac or a photothyristor including a MOSFET for zero crossing, and more particularly to prevent breakdown of a gate insulating film of a MOSFET.

2. Description of the Background Art

Figure 5:
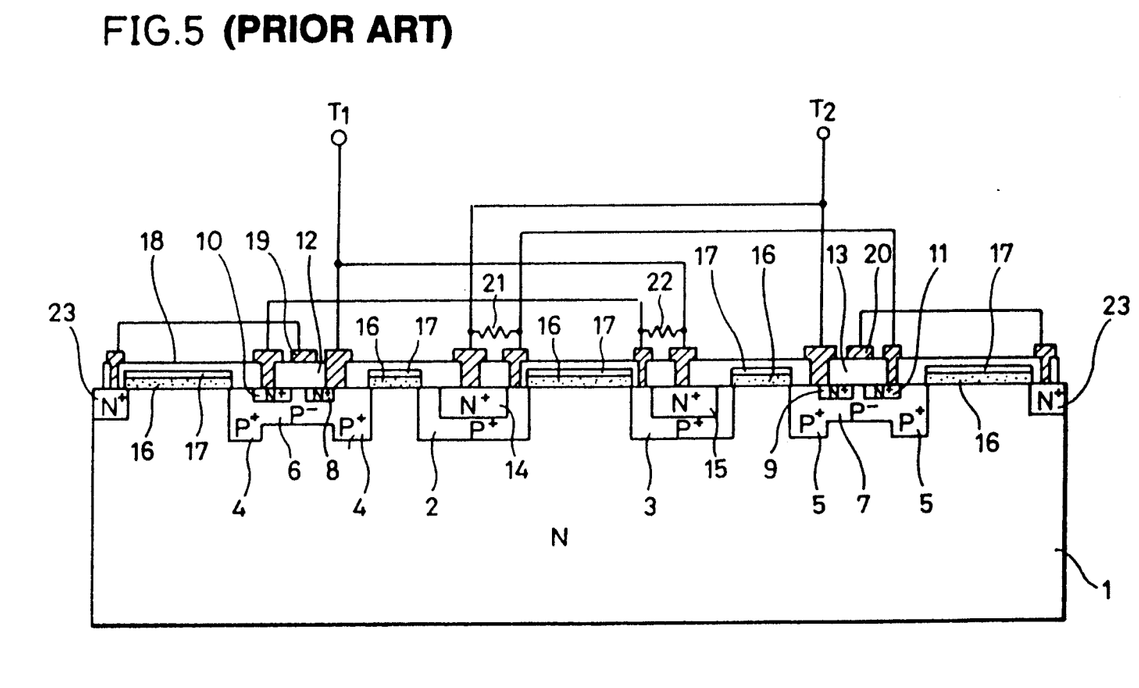
FIG. 5 schematically shows a sectional view of a conventional switching device.

FIG. 5 schematically shows a sectional view of a conventional phototriac. This phototriac has first and second P+ type gate regions 2 and 3, and P+ type anode regions 4 and 5 outwards thereof formed symmetrically at the surface layer of an N type semiconductor substrate 1. First and second N+ type cathode regions 14 and 15 are formed in the surface layer of first and second P+ type gate regions 2 and 3, respectively.

More specifically, a first thyristor includes P+ type anode region 4, N type substrate 1, P+ type gate region 2, and N+ type cathode region 14. A second thyristor includes P+ type anode region 5, N type substrate 1, P+ gate region 3, and N+ type cathode region 15.

Figure 1:
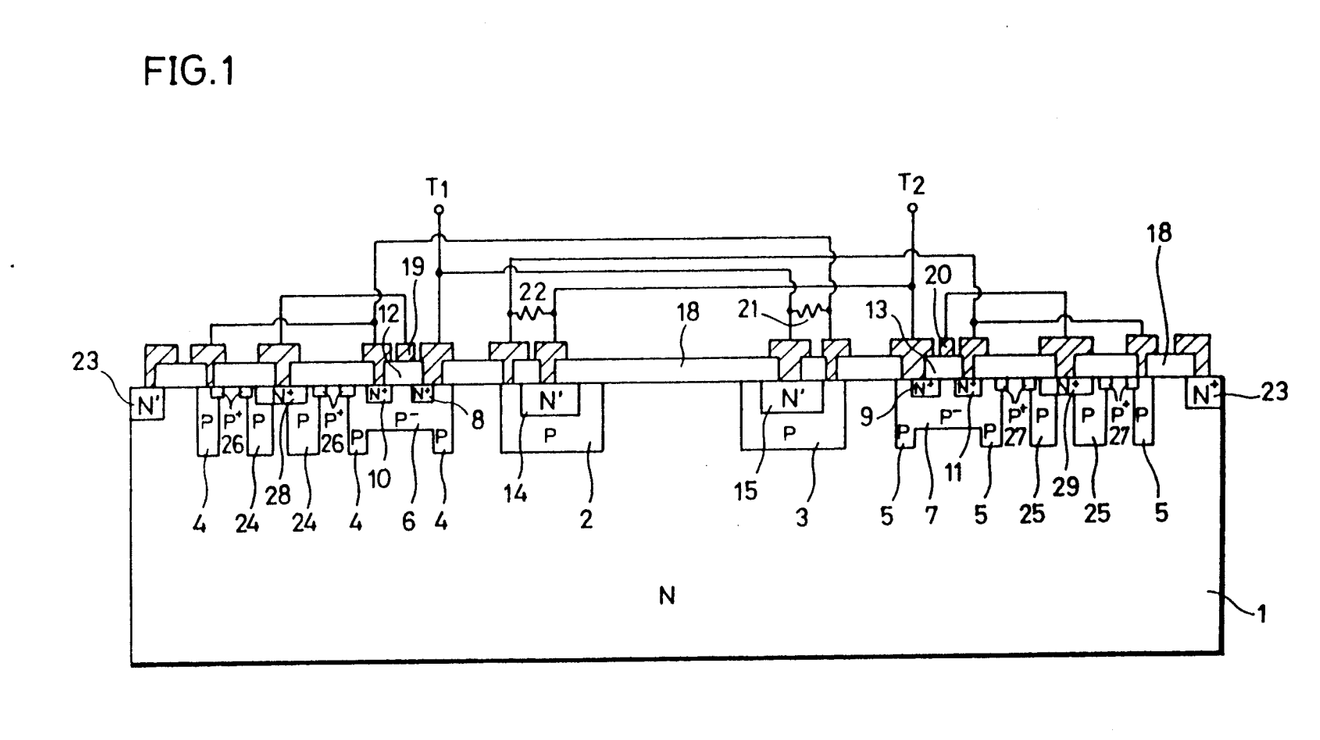
FIG. 1 is a schematical sectional view of a switching device according to an embodiment of the present invention.

Each of first and second P+ type anode regions 4 and 5 has a rectangular annular configuration. More specifically, anode regions 4 and 5 illustrated as two regions isolated from each other in the sectional view of FIG. 1 represent different portions of one continuous ring. First and second P− type well regions 6 and 7 are formed inwards of first and second anode regions 4 and 5.

In the surface layer of first and second well regions 6 and 7, first and second source regions 8 and 9 of N+ type, and then first and second drain regions 10 and 11 of N+ type are respectively formed. Between first source region 8 and first drain region 10, a first gate oxide film 12 and a first gate electrode 19 are stacked on first well region 6. Similarly, between second source region 9 and second drain region 11, a second gate oxide film 13 and a second gate electrode 20 are stacked on second well region 7.

More specifically, a first MOSFET includes well 6, source 8, drain 10, gate oxide film 12, and gate electrode 19. Similarly, a second MOSFET includes well 7, source 9, drain 11, gate oxide film 13, and gate electrode 20. These MOSFETs supply a zero crossing function to the phototriac of FIG. 5.

The surface of N type substrate 1 is covered with a semi-insulative polysilicon 16 having oxygen doped for passivation. The impurity concentration of N type substrate 1 is generally $10^{13}$–$10^{15}$ cm$^{-3}$. Semi-insulative, oxygen-doped polysilicon film 16 is used as a passivation film for the purpose of suppressing reduction of breakdown voltage of the device by preventing the potential in the lead wire connected to gate electrodes 19 and 20 of the MOSFET from affecting the surface of N type substrate 1.

A silicon nitride film 17 is stacked on semi-insulative polysilicon film 16, which is covered with a silicon oxide film 18.

First and second connection terminals $T_1$ and $T_2$ are used for electrical connection with an external circuit. First terminal $T_1$ is connected to first anode region 4, second cathode region 15, and first source region 8 via respective corresponding electrodes (hatched in FIG. 5). Second terminal $T_2$ is connected to second anode region 5, first cathode region 14 and second source region 9 via corresponding electrodes.

First drain region 10 is connected to second gate region 3, and second drain region 11 is connected to first gate region 2. First gate region 2 and first cathode region 14 are connected via a first resistor 21, and second gate region 3 and second cathode region 15 are connected via a second resistor 22. Although resistors 21 and 22 are represented in symbols of circuit elements in FIG. 5, they are actually formed by ion implantation into the surface layer of N type substrate 1. Gate electrodes 19 and 20 are connected to an N+ type channel stopper 23 formed at a peripheral portion of N type substrate 1.

Figure 6:
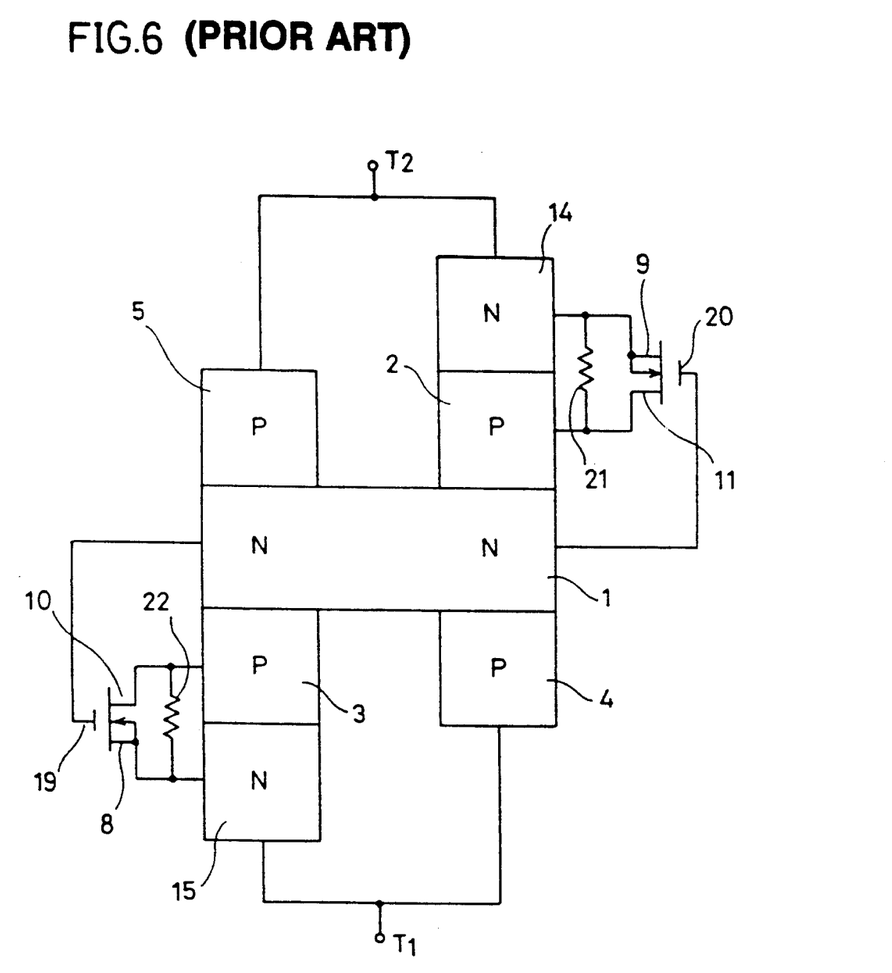
FIG. 6 is an equivalent circuit diagram representing the switching device of FIG. 5.

FIG. 6 is an equivalent circuit diagram representing the switching device of FIG. 5. It can be appreciated from FIG. 6 that a pair of thyristors each having a PNPN structure are connected in parallel in opposite directions between the two terminals $T_1$ and $T_2$. These thyristors are controlled by two MOSFETs having corresponding gate electrodes 19 and 20. More specifically, these thyristors operate to pass current only when the voltage applied across terminals $T_1$ and $T_2$ is lower than the threshold voltage of the corresponding MOSFET and when the corresponding gate regions 2 and 3 receive light.

The breakdown voltage of the phototriac of FIG. 5 is determined by the factors of:

(1) the impurity concentration of N type substrate 1;

(2) the depth of P type gate regions 2 and 3, and anode regions 4 and 5;

(3) the planar pattern of P type gate electrodes 2 and 3, and anode regions 4 and 5;

(4) the oxygen concentration in semi-insulative polysilicon film 16;

where (1) has the greatest dominance.

The breakdown voltage of the gate of the MOSFET is determined by the factors:

(1) the thickness of gate oxide films 12 and 13; and (2) the thickness of silicon oxide film 18 (generally formed by CVD) beneath the lead wire connecting gate electrodes 19 and 20 to channel stopper 23.

The gate oxide film must be an oxide film of high quality, and is generally formed by thermal oxidation. The thickness of the gate oxide film is approximately 1.2 µm in light of the manufacturing process. Phosphorus is lightly diffused from the surface of the gate oxide film for the purpose of gettering Na+ ions in the gate oxide film which will cause instability in the threshold voltage of the MOSFET. The diffusion depth of phosphorus into the gate oxide film is approximately 1000 Å, for example. The breakdown voltage of the gate oxide film is approximately 900–1000 volts.

When the resistivity of N type substrate 1 is approximately 40 Ω.cm and approximately 30% of oxygen is doped into semi-insulative polysilicon film 16, the breakdown voltage of the phototriac is approximately 700–900 volts.

This means that if the breakdown voltage of the phototriac is the higher value of approximately 900 volts due to variation in the resistivity of N type substrate 1, there will be no margin with respect to the breakdown voltage of approximately 900–1000 volts of the MOSFET. Therefore, there is a problem in that the MOSFET breaks down prior to the breakdown of the phototriac because of the voltage is also applied across terminals $T_1$ and $T_2$ applied to both sides of the gate oxide film of the MOSFET.

SUMMARY OF THE INVENTION

In view of the foregoing, an object of the present invention is to prevent breakdown of a gate insulating film of a MOSFET in a switching device such as a phototriac or a photothyristor including a MOSFET for zero crossing.

A switching device according to the present invention is formed on the main surface of an N type semiconductor substrate, including a thyristor and a MOSFET for providing zero crossing function to that thyristor, wherein the MOSFET includes a gate electrode electrically connected to the N type substrate during a normal operational state. The switching device further includes a voltage clamp circuit for preventing the voltage applied to the gate electrode of the MOSFET from exceeding a predetermined voltage. The voltage clamp circuit includes an N+ type contact region formed in the surface layer of the N type substrate and electrically connected to the gate electrode, and a P type guard ring surrounding the N+ type contact region, whereby a depletion layer expands all over inside the P type guard ring when the voltage applied to the gate electrode exceeds the predetermined voltage, and the N+ type contact region is electrically isolated from the N type substrate.

The switching device of the present invention has the maximum voltage applied to the gate of the MOSFET clamped by a clamp circuit, so that breakdown of the gate oxide film of the MOSFET can be reduced. Furthermore, because the influence of the potential of the lead wire connected to the gate electrode of the MOSFET can be reduced, a silicon oxide film can be used instead of semi-insulative polysilicon film 16 and silicon nitride film 17 on the N substrate surface, resulting in reducing the manufacturing cost of the switching device.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the these drawings, same or corresponding components have the same reference characters denoted.

DESCRIPTION OF THE PREFERRED EMBODIMENTS

Referring to FIG. 1, a switching device according to an embodiment of the present invention will be described hereinafter. The switching device of FIG. 1 is similar to that of FIG. 5, and additionally has two voltage clamp circuits which will be described afterwards.

In the switching device of FIG. 1, N type substrate 1 of a silicon single crystal having an N type impurity concentration of $10^{13}$–$10^{15}$cm$^{-3}$, for example. In the surface layer of N type substrate 1, first and second P type gate regions 2 and 3, first and second anode regions 4 and 5, and first and second P type guard rings 24 and 25 are formed symmetrically by doping boron. Each anode region 4 and 5 has an integrated configuration of 2 rings. First P type guard ring 24 is surrounded by the left ring of first anode region 4, and second P type guard ring 25 is surrounded by the right ring of second anode region 25. These P type guard rings 24 and 25 may be formed in the proximity of P type gate regions 2 and 3.

By doping boron, a first P$^-$ type well 6 is formed in the right ring of first anode region 4. Similarly, a second P$^-$ type well 7 is formed in the left ring of second anode region 5. By doping phosphorus, first and second N+ type cathode regions 14 and 15 are formed in the surface layer of first and second P type gate regions 2 and 3, respectively Also, an N+ type channel stopper 23 is formed at the same time.

By doping phosphorus, first and second N+ type source regions 8 and 9 and first and second N+ type drain regions 10 and 11 are respectively formed in the surface layer of first and second well regions 6 and 7, and first and second N+ type contact regions 28 and 29 are formed surrounded by first and second P type guard rings 24 and 25, respectively. N+ type contact regions 28 and 29 may be formed in a doping step different from that forming source regions 8 and 9 and drain regions 10 and 11 to independently control the threshold voltage of a MOSFET.

A first shallow P+ type region 26 is formed along the inner circumference of the left ring of first anode region 4 and along the outer circumference of the surrounding first P type guard ring 24. Simultaneously, a second shallow P+ type region 27 is formed along the inner circumference of the right ring of second anode region 5 and along the outer circumference of second P type guard ring 25.

In the embodiment of FIG. 1, first and second P type guard rings 24 and 25 are set at a floating state. The punch-through voltage between P type guard rings 24 and 25 and anode regions 4 and 5 is controlled to attain a predetermined voltage by the depth, the impurity concentration, and the opposing distance of shallow P+ type regions 26 and 27. The punch-through voltage inside P type guard rings 24 and 25 are controlled to attain a predetermined voltage by the doping depth, impurity concentration, and the opposing distance of the inner circumference faces. Furthermore, the breakdown voltage of the PN junction between N+ type contact regions 28 and 29 and P type guard rings 24 and 25 is controlled to be a predetermined value.

More specifically, a first voltage clamp circuit includes first P type guard ring 24, first shallow P+ type region 26, and first N+ type contact region 28. Similarly, a second voltage clamp circuit includes second P type guard ring 25, second shallow P+ type region 27, and second N+ type contact region 29.

The threshold voltages of the two MOSFETs are precisely controlled by adjusting the impurity concentration of well regions 6 and 7, the channel distance between the source and drain, and the thickness of the gate oxide film.

The doping of the above described P type and N type impurities can be carried out using ion implantation and thermal diffusion.

A silicon oxide film 18 is formed on the surface of N type substrate 1. Between source regions 8 and 9 and drain regions 10 and 11, silicon oxide film 18 is used as gate oxide films 12 and 13. Gate oxide films 12 and 13 have gate electrodes 19 and 20 formed thereon, respectively. A contact hole is formed at a desired position in silicon oxide film 18, and an aluminum electrode is formed. By the aluminum lead wire on silicon oxide film 18, first N+ type contact region 28 and gate electrode 19 of the first MOSFET are connected. Similarly, second N+ type contact region 29 and gate electrode 20 of the second MOSFET are connected.

Although first and second voltage clamp circuits are surrounded by first and second anode regions 4 and 5, respectively, in the embodiment of FIG. 1, the clamp circuits may be provided in the proximity of P type gate regions 2 and 3, or may be surrounded by P type gate regions 2 and 3. Although a phototriac including two photothyristors are shown in FIG. 1, the present invention may be applied to a single photothyristor.

Figure 2:
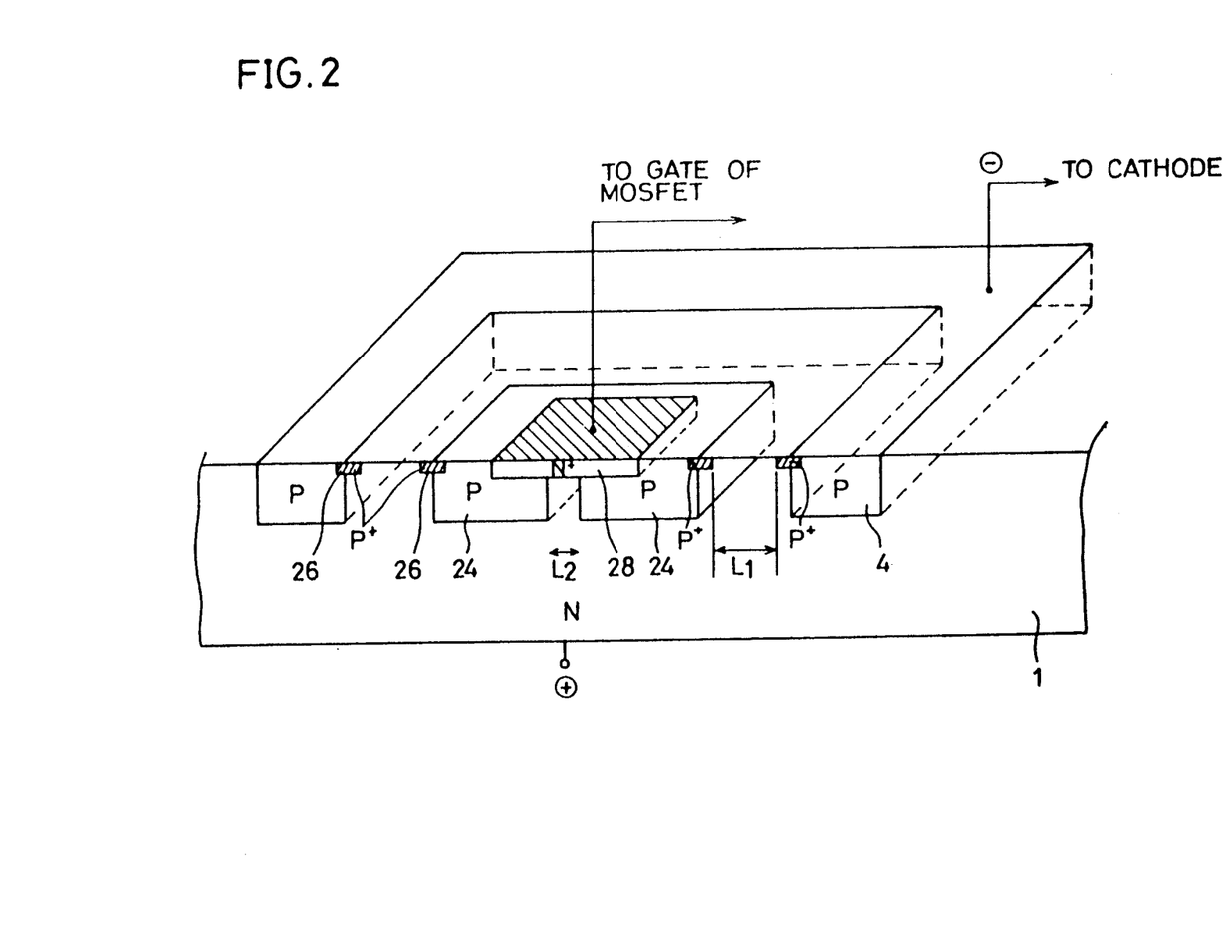
FIG. 2 is a perspective sectional view of a voltage clamp circuit in the switching device of FIG. 1.

FIG. 2 shows an enlarged diagram of the first voltage clamp circuit of FIG. 1. For the sake of simplicity, only the region surrounded by the left ring of first anode region 4 is shown. Also for the same reason, only a sectional view of first shallow P+ type region 26 is shown.

When a bias voltage applied across terminals $T_1$ and $T_2$ of the switching device is less than a punch-through voltage $V_P$ including a punch-through voltage $V_{P1}$ in the opposing distance $L_1$ between P type guard ring 24 under a floating state and anode region 4 and a punch-through voltage $V_{P2}$ in the opposing distance $L_2$ of the inner circumferencial faces of P type guard ring 24, N+ type contact region 28 is conductive with N type substrate 1, so that the potential $V_G$ of N+ type contact region 28 becomes identical to that of N type substrate 1. If a bias voltage exceeding punch-through voltage $V_P$ is applied, a depletion layer expands all over between anode region 4 and P type guard ring 24. Also, a depletion layer expands throughout the inside of P type guard ring 24, so that N+ type contact region 28 is electrically isolated from N type substrate 1. As a result, N+ type contact region 28 is clamped at a constant voltage. Shallow P+ type region 26 showing only its sectional view is formed by ion implantation and the like for controlling precisely the punch-through voltage.

Figure 3:
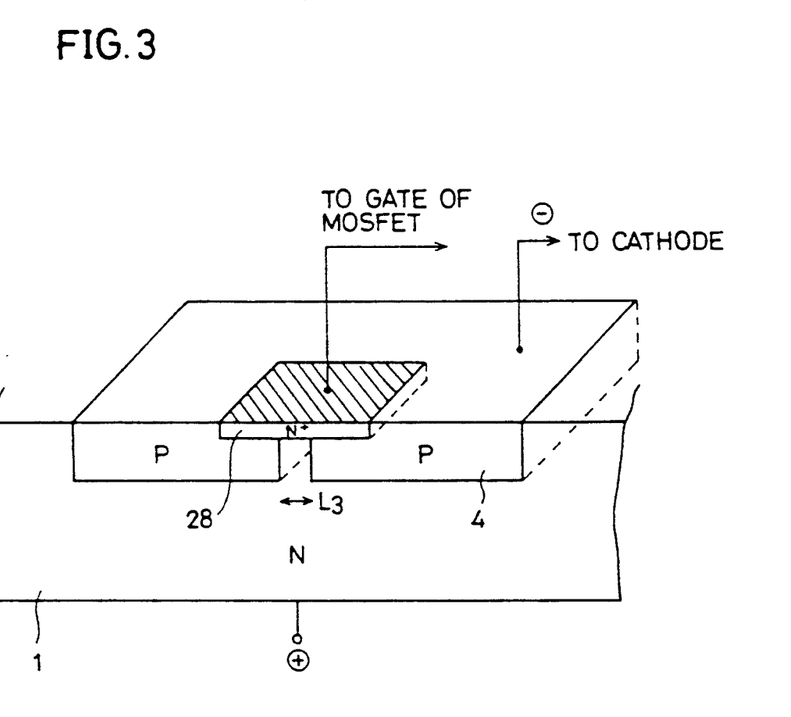
FIG. 3 is a perspective sectional view showing another example of a voltage clamp circuit.

FIG. 3 illustrates another example of a voltage clamp circuit of the present invention. The voltage clamp circuit of FIG. 3 has anode region 4 also serving as a guard ring enclosing N+ type contact region 28. In other words, the voltage clamp circuit of FIG. 3 is equivalent to the voltage clamp circuit of FIG. 2 having the distance $L_1$ eliminated. Therefore, in the voltage clamp circuit of FIG. 3, the maximum clamp voltage applied to N+ type contact region 28 is controlled to attain a predetermined value by adjusting the opposing distance $L_3$ of the inner circumferencial faces of anode region 4. In other words, if the bias voltage exceeds a predetermined value, a depletion layer expands throughout the inside of anode region 4, whereby N+ type contact region 28 is electrically isolated from N type substrate 1.

Figure 4:
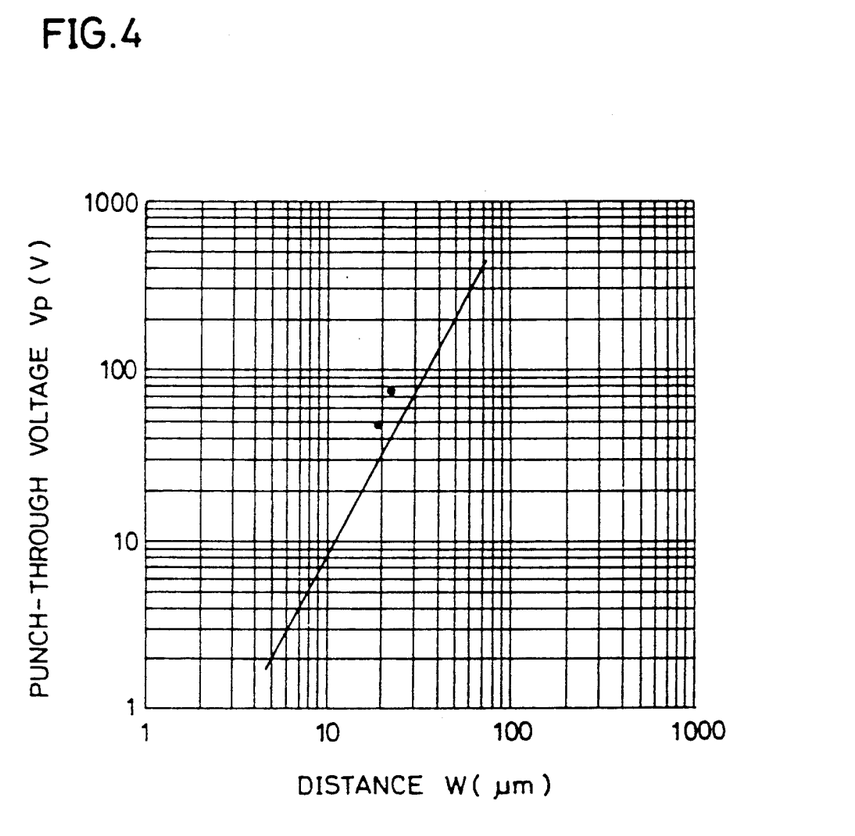
FIG. 4 is a graph showing the relationship between the distance and voltage of punch-through in the voltage clamp circuit of FIG. 2.

FIG. 4 is a graph showing the relationship between distance $W = L_1 + (L_2/2)$ and punch-through voltage $V_P$ in the voltage clamp circuit of FIG. 2. The abscissa represents the distance W (μm), and the ordinate represents the punch-through voltage $V_P$ (V). The inclining straight line represents the relationship determined by calculation, and the two black dots represent experimental data. A voltage clamp circuit can be designed using this graph.

In the measurement of the experimental data of FIG. 4, the resistivity of N type silicon substrate 1 was 50 Ω.cm; the impurity concentration in the proximity of the surface of P type guard ring 24 was $2 \times 10^{17} cm^{-3}$; P type guard ring 24 had a depth of 37 μm, and an impurity concentration of $2 \times 10^{17} cm^{-3}$ at the surface; and N type contact region 28 had a depth of 3.8 μm, and an impurity concentration of $3 \times 10^{19} cm^{-3}$ at the surface.

According to the present invention, the maximum voltage applied to the gate of the MOSFET providing zero crossing function to a switching device is limited, whereby breakdown of the gate oxide film of that MOSFET can be reduced. Also, the potential of the lead wire connected to the gate of the MOSFET with respect to the substrate is reduced to eliminate the need of a semi-insulative polysilicon passivation film on the N type substrate and a silicon nitride film, resulting in reducing the manufacturing cost of a switching device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A switching device formed on a main surface of an N-type semiconductor substrate, comprising:

a first thyristor, and a first MOSFET for detecting a zero voltage crossing and providing a first zero crossing signal to said thyristor, said MOSFET including a first gate electrode electrically connected to said N-type substrate, and a first voltage clamp circuit for preventing voltage applied to said gate electrode from exceeding a predetermined voltage including:

a first N+-type contact region formed in a surface layer of said N-type substrate and electrically connected to said gate electrode, and a first P-type guard ring surrounding said N+-type contact region, wherein a depletion layer expands throughout an interior region of said first P-type guard ring when the voltage applied to said first gate electrode exceeds said predetermined voltage to electrically isolate said first N+-type contact region from said N-type substrate.

2. The switching device according to claim 1, further comprising:

a second thyristor formed to implement a triac with said first thryistor, a second MOSFET for detecting a zero voltage crossing and providing a second zero crossing signal to said second thyristor, said second MOSFET including a second gate electrode electrically connected to said N-type substrate, and a second voltage clamp circuit for preventing voltage applied to said second gate electrode from exceeding another predetermined voltage including:

a second N+-type contact region formed in a surface layer of said N-type substrate and electrically connected to said second gate electrode, and a second P-type guard ring surrounding said second N+-type contact region, wherein a depletion layer expands throughout an interior region of said second P-type guard ring when the voltage applied to said second gate electrode exceeds said another predetermined voltage to electrically isolate said second N+-type contact region from said N-type substrate.

3. The switching device according to claim 1, wherein said first P-type guard ring is set to a floating state.

4. The switching device according to claim 2, wherein said first and second P-type guard rings are set to a floating gate.

5. The switching device according to claim 4, wherein said first and second thyristors include first and second anode regions, respectively, wherein said first and second P-type guard rings are surrounded by said first and second anode regions, respectively.

6. The switching device according to claim 5, wherein first shallow P+-type regions are provided along an outer circumference of said first P-type guard rind and an inner circumference of said first anode region opposing thereof, and second shallow P+-type regions are provided along an outer circumference of said second P-type guard ring and an inner circumference of the opposing said second anode region.

7. The switching device according to claim 2, wherein said first and second thyristors comprise first and second anode regions, respectively, and said first and second P-type guard rings are formed integrally with said first and second anode regions, respectively.

8. The switching device according to claim 2, wherein said first and second thyristors comprise first and second anode regions, respectively, formed in the surface layer of said N-type substrate, and said first and second MOSFETs are formed in P-type wells surrounded by said first and second anode regions, respectively.

* * * * *